US006480086B1

(12) United States Patent
Kluge et al.

(10) Patent No.: US 6,480,086 B1
(45) Date of Patent: Nov. 12, 2002

(54) INDUCTOR AND TRANSFORMER FORMED WITH MULTI-LAYER COIL TURNS FABRICATED ON AN INTEGRATED CIRCUIT SUBSTRATE

(75) Inventors: Wolfram Kluge; Dietmar Eggert; Saf Asghar, all of Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/468,014

(22) Filed: Dec. 20, 1999

(51) Int. Cl.[7] ................................................ H01F 5/00
(52) U.S. Cl. ...................... 336/200; 336/232; 336/223
(58) Field of Search ................................. 336/200, 223, 336/232, 83

(56) References Cited

U.S. PATENT DOCUMENTS

| | | | |
|---|---|---|---|
| 3,614,554 A | * 10/1971 | Shield et al. | 257/531 |
| 3,785,046 A | 1/1974 | Jennings | 29/602 |
| 5,396,101 A | 3/1995 | Shiga | 257/531 |
| 5,539,241 A | 7/1996 | Abidi et al. | 257/531 |
| 5,610,433 A | 3/1997 | Merrill et al. | 257/531 |
| 5,831,331 A | 11/1998 | Lee | 257/659 |
| 5,936,298 A | * 8/1999 | Capocelli et al. | 257/531 |
| 5,969,405 A | * 10/1999 | Aeugle | 257/531 |
| 6,067,002 A | * 5/2000 | Fujino et al. | 336/200 |

FOREIGN PATENT DOCUMENTS

JP 06061058 A 4/1994

OTHER PUBLICATIONS

Patent Abstracts of Japan, vol. 018, No. 290 (E–1447), Jun. 2, 1994 and JP 06 061068 A (Rohm Co. Ltd.), Mar. 4, 1994 Abstract.

* cited by examiner

*Primary Examiner*—Anh Mai
(74) *Attorney, Agent, or Firm*—Williams, Morgan & Amerson

(57) ABSTRACT

An inductor and transformer comprise a plurality of interleaved conductive layers and insulation layers fabricated on a monolithic semiconductor integrated circuit die. The conductive layers are shaped into coil turns of the inductor and the transformer, and are stacked vertically (perpendicular to the horizontal plane of the coil layers) and proximate to one another so as to achieve close magnetic coupling therebetween, thereby achieving a larger inductance value for a given sized coil structure. The conductive layer coil turns are connected together with conductive vias through the interposing insulation layers.

12 Claims, 4 Drawing Sheets

INDUCTOR AND TRANSFORMER FORMED WITH MULTI-LAYER COIL TURNS FABRICATED ON AN INTEGRATED CIRCUIT SUBSTRATE

BACKGROUND OF THE INVENTION

1. Field of the Invention

The present invention relates to passive components fabricated on a semiconductor integrated circuit die, and more particularly, to inductors and transformers fabricated on the integrated circuit die and comprising a plurality of conductive layers having insulation layers interleaved therebetween.

2. Description of the Related Technology

Analog electronic circuits, especially those operating at radio frequency, may include inductors and transformers for filtering, frequency mixing, oscillators, interstage radio frequency coupling, and high frequency pulse coupling. Transformers are adapted to pass alternating current (AC) signals and block direct current (DC). Inductors and transformers have been fabricated in many forms, from large iron core transformers used at power frequencies to air core inductors used at radio frequencies. Radio frequency inductors and transformers have been enclosed in metal cans, non-conductive coil forms, open construction, fabricated onto a printed circuit board and the like. More recently with the advent of integrated circuits and electronic miniaturization the need arose to reduce the size of external discrete components necessary with an integrated circuit product, preferably, elimination of any discrete components was a primary goal. More and more formerly discrete components were fabricated onto integrated circuits, i.e., resistors, capacitors and inductors, for both size and cost reasons. Inductors were especially a problem because the physical size and geometry normally required for an effective inductor over a desired range of frequencies.

An inductor fabricated on an integrated circuit substrate generally has been formed in the shape of a spiral coil structure in a single metal layer on an insulation layer using typical integrated circuit fabrication techniques. This spiral coil structure requires a substantial area of the silicon integrated circuit substrate, typically for example, 200 $\mu m \times 200$ $\mu m$. The spiral coil structure also suffers from parasitic capacitive influence from the integrated circuit substrate on which it is fabricated. Fabrication on an integrated circuit substrate of an efficient transformer (two inductors electromagnetically coupled together) is also extremely difficult using spiral coil structure shapes because of the physical size required and the inherent parasitic capacitance which may render the resulting transformer structure inefficient or ineffective for a desired purpose.

What is needed are more effective and efficient inductor and transformer structures that may be easily and inexpensively fabricated on an integrated circuit substrate and do not have to occupy a substantial area of the substrate.

SUMMARY OF THE INVENTION

The present invention overcomes the above-identified problems as well as other shortcomings and deficiencies of existing technologies by providing on a monolithic semiconductor integrated circuit die an inductor comprising a plurality of conductive layers shaped into coil turns and interleaved with a plurality of insulation layers. The conductive layer coil turns are stacked vertically (perpendicular to the horizontal plane of the conductive coil layers) and proximate to one another so as to achieve close magnetic coupling therebetween, thereby achieving a larger inductance value for a given sized coil structure. The conductive layer coil turns are connected together with conductive vias through the interposing insulation layers. It is contemplated and within the scope of the present invention that the conductive layer coil turns may be of any shape, such as for example but not limitation, round, square, triangular, oval, hexagonal and the like.

According to an embodiment of the invention, a transformer may be fabricated in a similar fashion by having concentric or co-axial inductors formed from the plurality of conductive coil layers with a plurality of insulation layers interleaved therebetween. The vertically stacked conductive coil layers of each of the individual inductors of the transformer are connected together with conductive vias through the interposing insulation layers. The conductive vias may include a plurality of vias connecting adjacent conductive coil layers so as to keep series resistance low in the connection thereof. The conductive layers (coil turns) and vias may be made from metal such as copper, aluminum, alloys and the like; doped polysilicon, or any other type of conductive material that may be used in the fabrication of circuits and connections on an integrated circuit substrate.

In an embodiment of the present invention, fabricated on a monolithic semiconductor integrated circuit die is a plurality of conductive layers with a plurality of insulation layers therebetween. The conductive and insulation layers are interleaved one with the other. Each of the plurality of coil turn conductive layers has substantially the same diameter and an insulation layer is interposed between two adjacent coil turn conductive layers. The insulation layer is only as thick as required, resulting in the adjacent coil turn conductive layers having increased magnetic coupling and reduced parasitic capacitance with the substrate. In addition, the adjacent closely spaced and vertically stacked coil turns have substantially the same voltage potential thereon so that capacitive coupling therebetween is minimized. Only one coil turn is adjacent to the integrated circuit substrate and has a relatively small footprint. This greatly reduces parasitic capacitance from the substrate. Conductive Vias are formed in the insulation layers between adjacent coil turns of the conductive layers and connect the end points (open portions) of the adjacent coil turns together.

In another embodiment of the present invention, the plurality of conductive layers having a plurality of insulation layers therebetween are arranged as two inductor coils. The two coils are concentric, one of the inductor coils located within the other one and coaxially aligned therein. Each conductive layer comprises a coil turn for each of the two inductor coils. The conductive and insulation layers are interleaved one with the other. The one (first) of the two inductor coils has a larger inside diameter then the outside diameter of the other one (second) of the two coils, wherein the second inductor coil fits inside of the first inductor coil and is concentric therewith. It is contemplated and within the scope of the present invention that the first and second inductor coils have the same number of turns (same number of layers) or a different number of turns (some of the conductive layers not used by one or the other of the two inductor coils). Thus impedance matching and/or voltage step-up or step-down between the input and output of the transformer may be readily achieved with this embodiment of the invention. The adjacent coil turn conductive layers have increased magnetic coupling therebetween and reduced parasitic capacitance with the substrate. In addition, the adjacent closely spaced and vertically stacked coil turns have substantially the same voltage potential thereon so that capacitive coupling therebetween is minimized. Only one coil turn of each of the two inductor coils is adjacent to the integrated circuit substrate and has a relatively small footprint. This greatly reduces parasitic capacitance from the substrate to the transformer. Conductive Vias are formed the insulation layers between adjacent coil turns of the conductive layers and connect the end points (open portions) of the adjacent coil turns together.

According to the aforementioned embodiments of the present invention, the insulation layers between the coil turns of the inductor(s) may preferably be very thin so that the adjacent turns of the coil are close together, thus, improving the magnetic coupling therebetween and increasing the effective inductance for a given size coil diameter. It is also contemplated and within the scope of the present invention that a material of high magnetic permeability may be used by locating same within the coil so as to further increase the effective inductance value for a give size of coil structure. This material may be, for example but not limitation: iron, iron oxide, ferrite ceramic, ferrous oxide or other materials that increase the effective inductance value of the inductor coil and transformer.

An advantage of the present invention is that the inductor/transformer structure occupies less area of the integrated circuit substrate.

Another advantage is that parasitic capacitance of the integrated circuit substrate is reduced.

Still another advantage is mutual inductance or inductive coupling between the two coils of the transformer is enhance because of the close proximity of the two coils.

A feature of the present invention is fabricating a coil inductor on a semiconductor integrated circuit die by depositing each conductive layer turn of the coil on a respective insulation layer and connecting the turns together with conductive vias through these respective insulation layers.

Yet another feature is using a plurality of vias between adjacent conductive layer turns to reduce the connection resistance therebetween.

Another feature is positioning a second coil concentrically inside of a first coil on an integrated circuit substrate so that both of the first and second coils are in coaxial alignment and electromagnetically coupled together to form a transformer.

Still another feature is impedance matching with a transformer fabricated on the integrated circuit substrate.

Another feature is placing a magnetic material within the coil fabricated on the integrated circuit substrate for increasing the inductance thereof.

Yet another feature is AC voltage step-up and step-down with a transformer fabricated on the integrated circuit substrate.

Other and further features and advantages will be apparent from the following description of presently preferred embodiments of the invention, given for the purpose of disclosure and taken in conjunction with the accompanying drawings.

DETAILED DESCRIPTION OF THE PREFERRED EMBODIMENT

Figure 1:
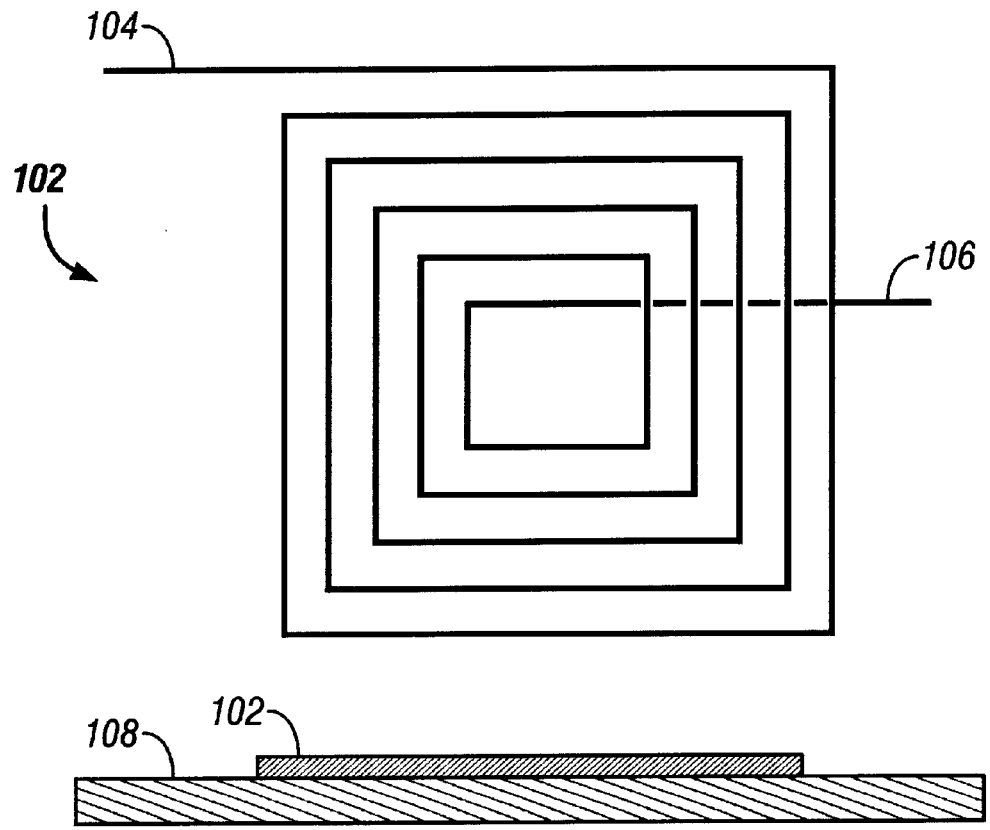
FIG. 1 is a schematic plan view of a prior art inductor comprising a spiral wound coil fabricated on an integrated circuit substrate.

Referring to FIG. 1, a schematic diagram of a prior art inductor comprising a spiral wound coil fabricated on an integrated circuit substrate is illustrated. The spirally wound coil 102, having a first end 104 and a second end 106, is interposed on an insulation layer (not illustrated) of a semiconductor integrated circuit substrate 108. The flat spiral wound coil 102 suffers from parasitic capacitive coupling to the substrate 108, and requires a great deal of area on the substrate 102.

The present invention is an inductor, fabricated on monolithic semiconductor integrated circuit die, comprising a plurality of conductive layers shaped into coil turns and interleaved with a plurality of insulation layers. It is contemplated and within the scope of the present invention that a plurality of inductors may be a fabricated as disclosed herein, and that the plurality of inductors may be positioned in relation to one another for electromagnetic coupling therebetween to form a transformer. It is also contemplated and within the scope of the present invention that the conductive layer coil turns may be of any shape, such as for example but not limitation, round, square, triangular, oval, hexagonal and the like.

Referring now to the drawings, the details of preferred embodiments of the present invention are schematically illustrated. Like elements in the drawings will be represented by like numbers, and similar elements will be represented by like numbers with a different lower case letter suffix.

Figure 2A:
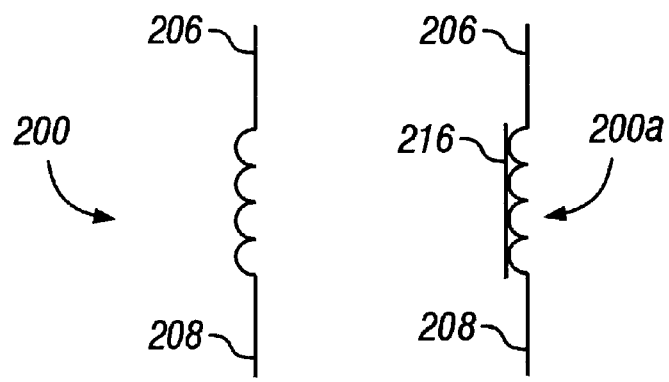
FIG. 2A is a schematic diagram of transformers, according to embodiments of the present invention.
Figure 2B:
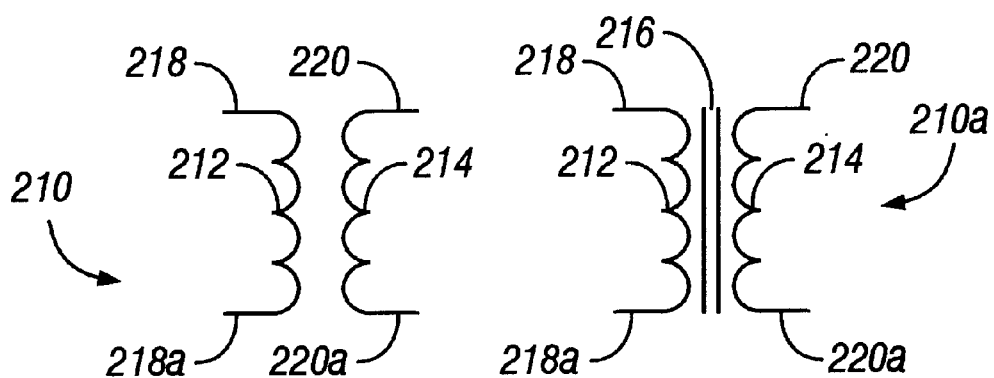
FIG. 2 and is a schematic diagram of inductors, according to embodiments of the present invention.

Referring to FIG. 2, a schematic diagram of inductors of the embodiments of the invention is illustrated. An inductor of the present invention is generally represented by the numeral 200, and another inductor of the present invention having a magnetic core 216 proximate to the coil turns is generally represented by the numeral 200a. The inductors 200 and 200a have a first node 206 and an second node 208.

Referring to FIG. 2A, a schematic diagram of the inductors arranged as a transformer of the embodiments of the invention is illustrated. A transformer of the present invention is generally represented by the numeral 210, and another transformer of the present invention having a magnetic core 216 is generally represented by the numeral 210a. A first coil 212 and a second coil 214 comprise the transformer 210. The transformer 210 has input nodes 218, 218a for the coil 212, and output nodes 220 and 220a for the coil 214. One of ordinary skill in the art will readily understand that the input nodes 218 and the output nodes 220 may be reversed or switched for inverting the phase of the input signal by 180 degrees at the output. Also the coils 212 and 214 may be interchanged as output and input coils, respectively. In addition, the number of coil turns (conductive layers used) may be different for the coil 212 and the coil 214, thereby obtaining an impedance change or voltage step-up or step-down depending on the turns ratio of coil 212 and coil 214.

Figure 3A:
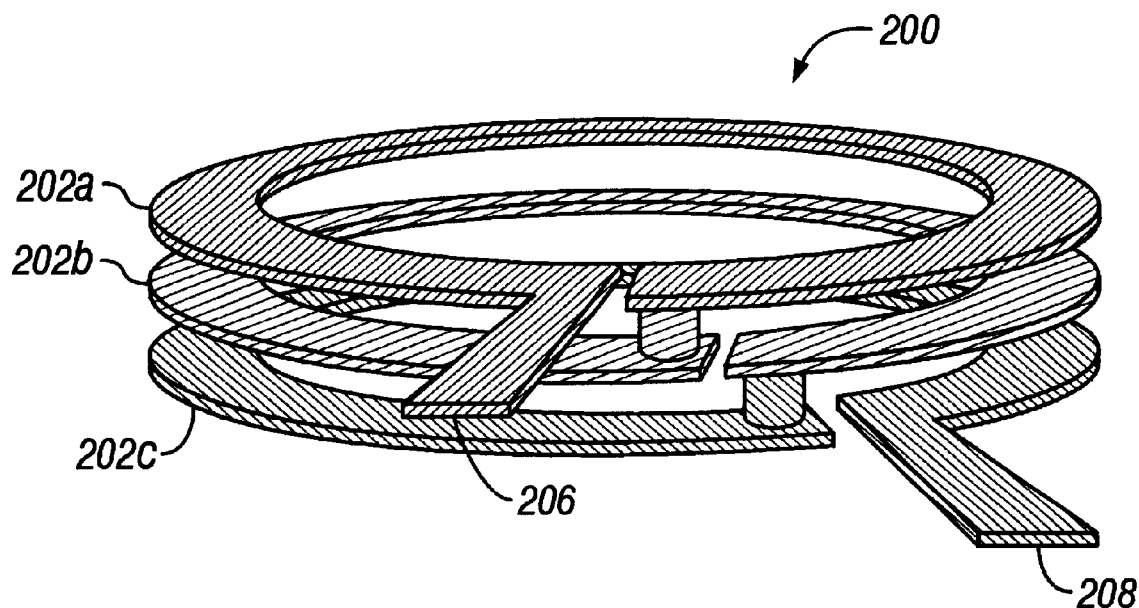
FIG. 3A is a schematic orthogonal view of a coil portion having a magnetic core of the embodiment of the invention illustrated in FIG. 2.
Figure 3B:
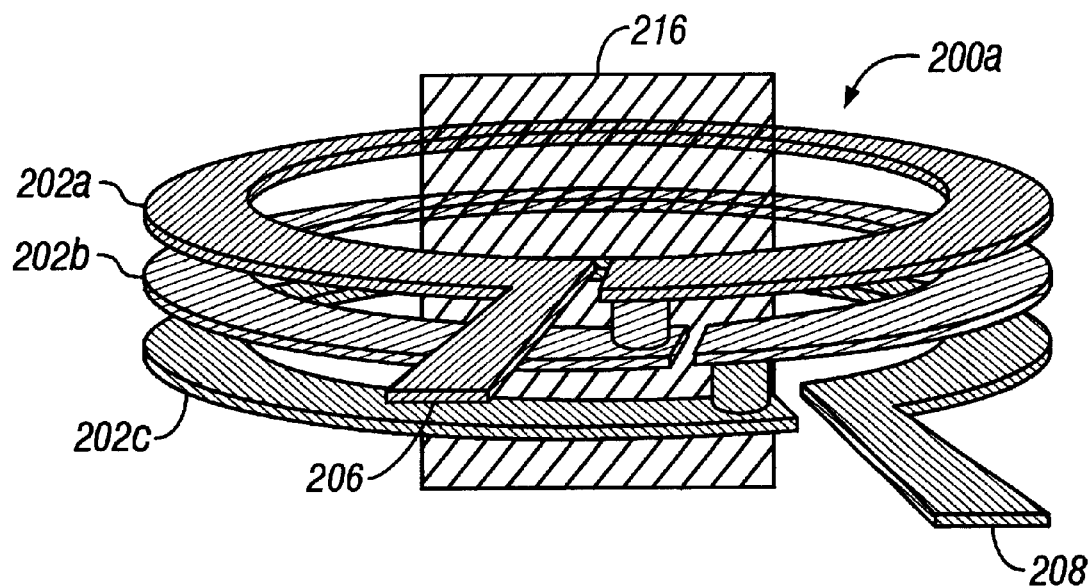
FIG. 3 is a schematic orthogonal view of a coil portion of the embodiment of the invention illustrated in FIG. 2.

Referring now to FIG. 3, a schematic orthogonal view of a coil portion of the inductor 200 is illustrated. The inductor 200 is fabricated on a semiconductor integrated circuit substrate (not illustrated). The inductor 200 is comprised of a plurality of turns formed from conductive layers that are coil shaped. These coil shaped conductive layers, illustrated in FIG. 3 as coil turns 202a, 202b and 202c, are formed on a plurality of insulation layers (not illustrated for clarity). Each coil shaped conductive layer is formed on a respective insulation layer (See FIG. 5). Conductive Vias are formed in the insulation layers between adjacent coil turns of the conductive layers and connect the end points (open portions) of the adjacent coil turns together (See FIG. 5). The conductive layers (coil turns) and vias may be made from metal such as copper, aluminum, metal alloys and the like; doped polysilicon, or any other type of conductive material that may be used in the fabrication of circuits and connections on an integrated circuit substrate.

Referring to FIG. 3A, a schematic orthogonal view of the coil portion of the inductor 200a having a magnetic core 216 to increase the inductance of the coil 200a is illustrated. The magnetic core 216 is comprised of a material of high magnetic permeability and is located, preferably, within the coil 200a so as to further increase the effective inductance for a give size of coil structure. This material may be, for example but not limitation, iron oxide, ferrite ceramic, ferrous oxide or other materials that increase the effective inductance of the inductor coil.

Figure 4A:
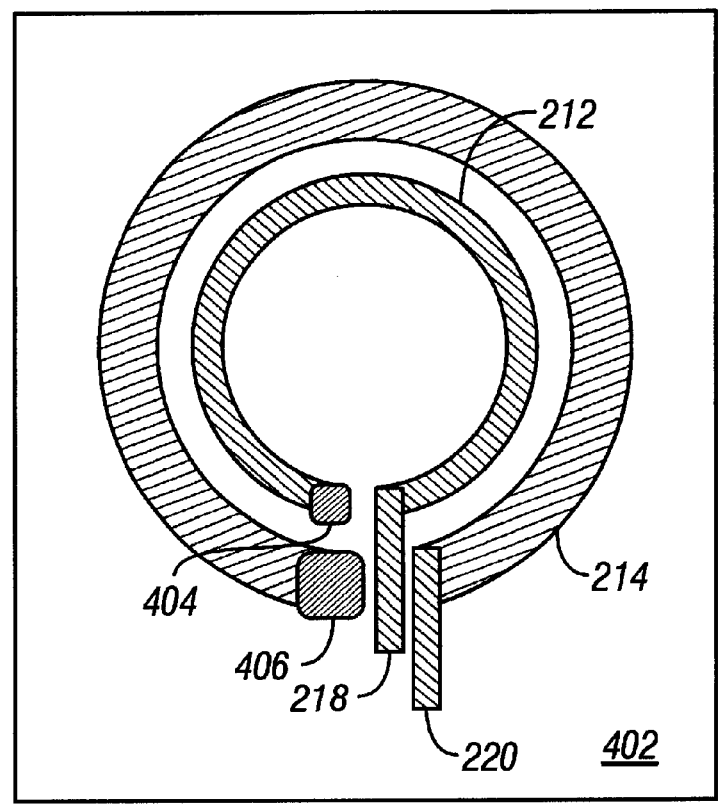
FIG. 4A is a schematic plan view of a transformer portion having a magnetic core of the embodiment of the invention illustrated in FIG. 2A.
Figure 4B:
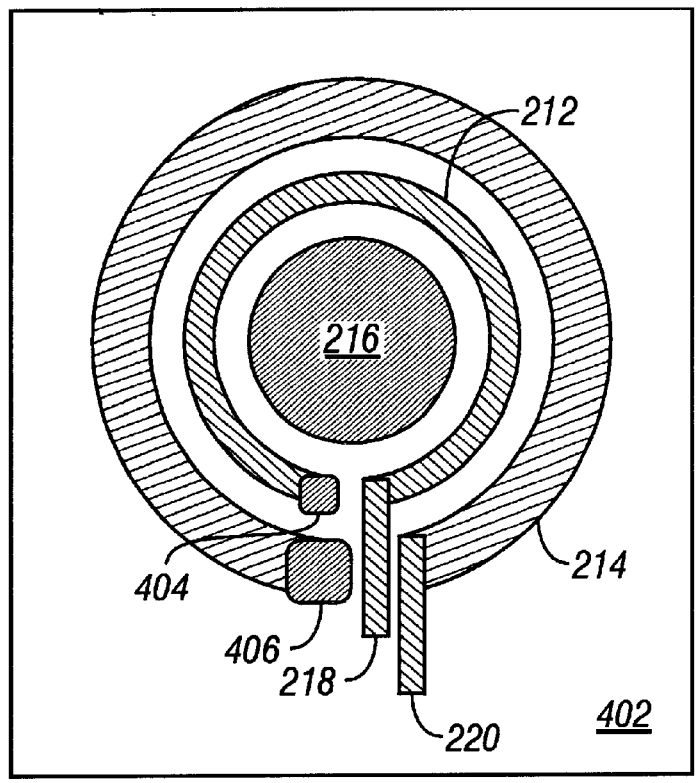
FIG. 4 is a schematic plan view of a transformer portion of the embodiment of the invention illustrated in FIG. 2A.

Referring to FIG. 4, a schematic plan view of a transformer portion of the embodiment of the invention in FIG. 2A is illustrated. The first coil 212 has the input 218 and a via 404 which connects the illustrated conductive layer coil turn end point of the first coil 212 to the end point of the next adjacent coil turn thereof (see FIG. 5). In the same fashion, the second coil 214 has the input 220 and a via 406 which connects the illustrated conductive layer coil turn end point of the second coil 214 to the end point of the next adjacent coil turn (see FIG. 5). The first and second coils 212 and 214 are concentric, in coaxial alignment and close proximity. This enhances the mutual electromagnetic coupling therebetween. In addition, these adjacent, closely spaced and vertically stacked coil turns have substantially the same voltage potential thereon so that capacitive coupling therebetween is minimized.

Referring to FIG. 4A, a schematic plan view of a transformer portion having a magnetic core to increase the inductance of the transformer is illustrated. The magnetic core 216 is comprised of a material of high magnetic permeability, and is, preferably, located within the coils 212 and 214 so as to further increase the effective inductance for a give size of coil structure of the transformer. This material may be, for example but not limitation, iron oxide, ferrite ceramic, ferrous oxide or other materials that increase the effective inductance of the inductor coil.

Figure 5:
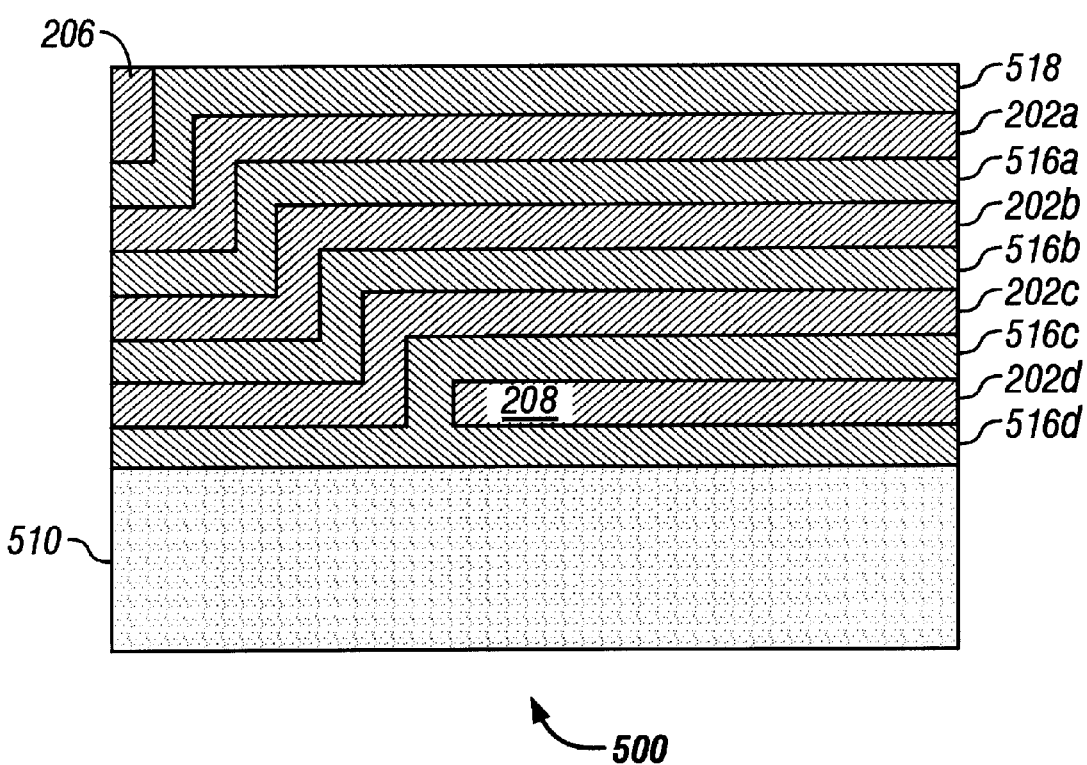
FIG. 5 is a schematic elevational cross-section view of the inductor coil structure of FIG. 3, fabricated on a semiconductor integrated circuit die.

Referring now to FIG. 5, a schematic elevational cross-section view of the conductive layer coil turns of the inductor 200 fabricated on a semiconductor integrated circuit substrate 510 is illustrated. A first coil turn 202d is formed over an insulation layer 516d. An end of the first coil turn 202d is connected to a connection node 208. An insulation layer 514c is formed over the first coil turn 202d.

A second coil turn 202c is formed over the insulation layer 516c. Another insulation layer 516b is formed over the second coil turn 202c. A third coil turn 202b is formed over the insulation layer 516b. Still another insulation layer 516a is formed over the third coil turn 202b. Yet another insulation layer 514a is formed over the third coil turn 202b. A fourth coil turn 202a is formed over the insulation layer 516a. Another insulation layer 518 may be formed over the fourth coil turn 202a. An end of the fourth coil turn 202d is connected to the connection node 206. Vias (represented by the vertical conductive connections in FIG. 5) interconnect the end portions of the coil turns 202a and 202b, 202b and 202c, and 202c and 202d, respectively. It is contemplated and with the scope of the present invention that any number of coil turns and insulation layers may used.

The present invention, therefore, is well adapted to carry out the objects and attain the ends and advantages mentioned, as well as others inherent therein. While the present invention has been depicted, described, and is defined by reference to particular preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An integrated circuit apparatus having a transformer thereon, said apparatus comprising:

an integrated circuit substrate;

a first insulation layer over a face of said integrated circuit substrate;

a plurality conductive layers, each of said plurality of conductive layers shaped in the form of a first coil turn and a second coil turn wherein the first coil turn is concentrically located within the second coil turn, the first and second coil turns each having first and second ends;

a plurality of insulation layers interleaved between said plurality of conductive layers;

a one of said plurality of conductive layers proximate to said first insulation layer and the other ones of said plurality of conductive layers stacked over the one with said plurality of insulation layers interleaved therebetween; and a plurality of conductive vias connecting adjacent ones of the first and second coil turns of said plurality of conductive layers, thereby forming a transformer comprising a first coil and a second coil.

2. The apparatus of claim 1, wherein respective ones of said plurality of conductive vias connect second ends of each of the ones of the first and second coil turns of said plurality of conductive layers to first ends of each of the adjacent ones of the first and second coil turns, respectively, of said plurality of conductive layers, thereby forming the first and second coils which are concentrically aligned.

3. The apparatus of claim 2, wherein each of the respective ones of said plurality of conductive vias is at least one via.

4. The apparatus of claim 2, wherein each of the respective ones of said plurality of conductive vias is two or more vias so as to reduce electrical connection resistance thereof.

5. The apparatus of claim 1, wherein the first and second coil turns of said plurality of conductive layers are selected from the group consisting of round, square, rectangle, triangle, oval, hexagon and octagon.

6. The apparatus of claim 1, wherein said plurality of conductive layers is made of metal.

7. The apparatus of claim 6, wherein the metal is selected from the group consisting of copper, aluminum, copper alloy and aluminum alloy.

8. The apparatus of claim 1, wherein said plurality of conductive layers is made of conductive doped polysilicon.

9. The apparatus of claim 1, further comprising a magnetic material interposed inside of an inner diameter of the first coil turn of said plurality of conductive layers so as to increase the inductance thereof.

10. The apparatus of claim 9, wherein the magnetic material is selected from the group consisting of iron, iron oxide, ferrite ceramic and ferrous oxide.

11. The apparatus of claim 1, wherein the number of the first coil turns connected together to form the first coil is different than number of the second coil turns connected together to form the second coil, wherein an impedance change occurs between the first and second coils.

12. The apparatus of claim 1, wherein the number of the first coil turns connected together to form the first coil is different then the number of the second coil turns connected together to form the second oil, wherein a voltage change occurs between the first and second coils.

* * * * *